(12) United States Patent
Sakurai et al.

(10) Patent No.: US 7,538,707 B2
(45) Date of Patent: May 26, 2009

(54) DIGITAL-TO-ANALOG CONVERTING CIRCUIT AND DIGITAL-TO-ANALOG CONVERTING METHOD

(75) Inventors: Satoshi Sakurai, Kanagawa (JP); Asami Saito, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/861,547

(22) Filed: Sep. 26, 2007

(65) Prior Publication Data

US 2008/0079619 A1 Apr. 3, 2008

(30) Foreign Application Priority Data

Sep. 29, 2006 (JP) .............................. 2006-268816

(51) Int. Cl.
*H03M 1/66* (2006.01)
(52) U.S. Cl. ........................... 341/144; 341/153
(58) Field of Classification Search ................. 341/118, 341/120, 143, 144, 153
See application file for complete search history.

(56) References Cited

U.S. PATENT DOCUMENTS

| | | | |
|---|---|---|---|
| 3,982,172 A | 9/1976 | Plassche | |
| 4,703,310 A | 10/1987 | Plassche | |
| 6,426,715 B1 * | 7/2002 | Westra et al. | 341/144 |
| 6,522,277 B2 * | 2/2003 | Fujimori et al. | 341/144 |
| 2003/0001764 A1 * | 1/2003 | Ruha et al. | 341/144 |
| 2004/0041719 A1 * | 3/2004 | Schreier | 341/144 |
| 2005/0068215 A1 * | 3/2005 | Zhao et al. | 341/153 |
| 2005/0116851 A1 * | 6/2005 | Clara et al. | 341/144 |
| 2006/0022857 A1 * | 2/2006 | Chen | 341/144 |
| 2006/0114138 A1 * | 6/2006 | Eloranta | 341/144 |

* cited by examiner

*Primary Examiner*—Howard Williams
(74) *Attorney, Agent, or Firm*—Amin, Turocy & Calvin, LLP

(57) ABSTRACT

A digital-to-analog converting circuit includes: 2N or more number of digital-to-analog converting elements converting an input digital code of N+1 (N is an integer equal to or more than two) values to an analog code to output; a selecting section selecting N-number of digital-to-analog converting elements; and a control section controlling a second selecting so that each of at least N-number of digital-to-analog converting elements used for the digital-to-analog converting does not continuously output the same analog code at a second digital-to-analog converting timing following a first selecting of the N-number of digital-to-analog converting elements by the selecting section at a first digital-to-analog converting timing.

5 Claims, 8 Drawing Sheets

| | | D/A CONVERTING ELEMENT | | | | | | | | | | | | | | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 |
| ANALOG OUTPUT | +2 | H | H | H | H | H | | | | | | | | | | L | L | L |
| | +6 | | | | | | H | H | H | H | H | H | H | L | | | | |
| | +4 | H | H | | | | | | | | | | L | L | H | H | H | H |
| | 0 | | | H | H | H | H | L | L | L | L | | | | | | | |
| | -4 | L | L | L | L | L | L | H | H | | | | | | | | | |

H H (+1)    L L (-1)    ☐ Z

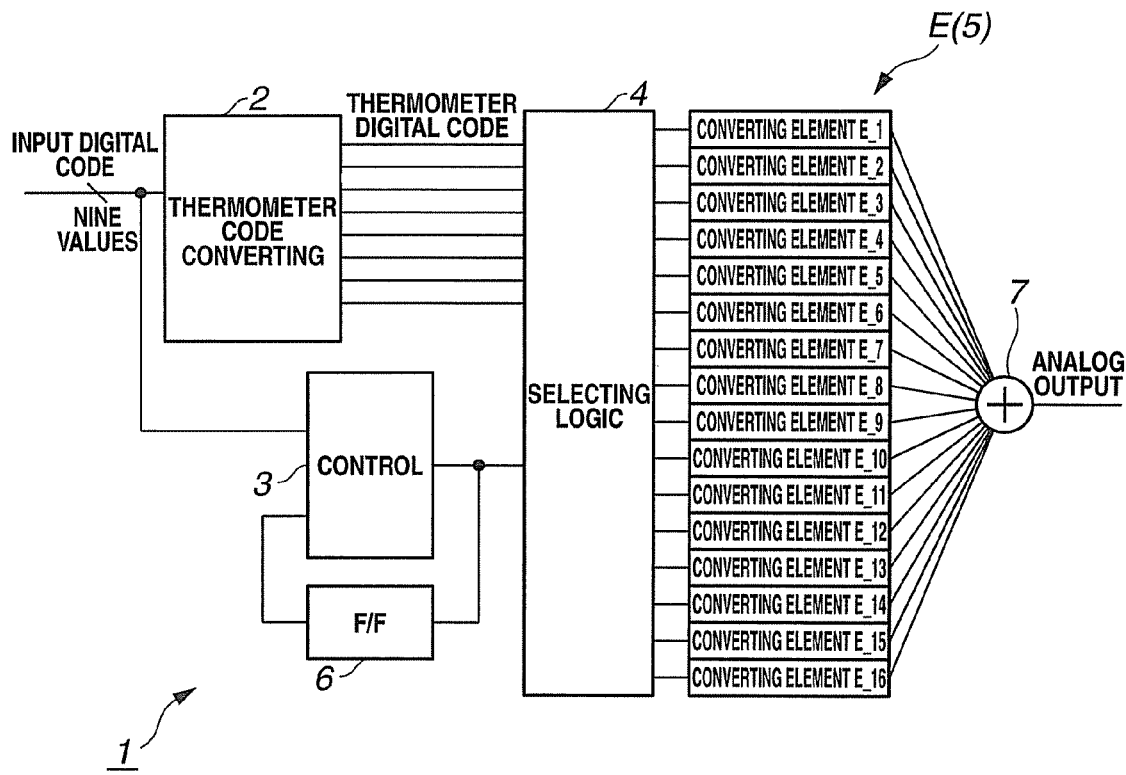

FIG.5

| ANALOG OUTPUT | D/A CONVERTING ELEMENT | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| +2 | H | H | H | H | H | | | | | | | | | L | L | L |
| +6 | | | | | | H | H | H | H | H | H | H | L | | | |
| +4 | H | H | | | | | | | | | | L | L | H | H | H |
| 0 | | | H | H | H | H | L | L | L | L | | | | | | |
| -4 | L | L | L | L | L | L | H | H | | | | | | | | |

| ANALOG OUTPUT | D/A CONVERTING ELEMENT | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| +8 | H | H | H | H | H | H | H | H | | | | | | | | |
| +6 | | | | | | | | | H | H | H | H | H | H | H | L |
| +4 | H | H | H | H | H | H | L | L | | | | | | | | |
| +2 | | | | | | | | | H | H | H | H | H | L | L | L |
| 0 | H | H | H | H | L | L | L | L | | | | | | | | |
| -2 | | | | | | | | | H | H | H | L | L | L | L | L |
| -4 | H | H | L | L | L | L | L | L | | | | | | | | |
| -6 | | | | | | | | | H | L | L | L | L | L | L | L |
| -8 | L | L | L | L | L | L | L | L | | | | | | | | |

| ANALOG OUTPUT | E2H [H (+1)] | | | | | | | | | | | | | | | | E2L [L (-1)] | | | | | | | | | | | | | | | |
|---|---|---|---|---|---|---|---|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 1 | 2 | 3 | 4 | 5 | 6 | 7 | 8 | 9 | 10 | 11 | 12 | 13 | 14 | 15 | 16 |
| +2 | H | H | H | H | H | | | | | | | | | | | | | | | | | | | | | | | | | | | |
| +6 | | H | H | H | H | H | H | H | H | H | H | H | | | | | | | | | | | | | | | | | | | | |
| +4 | H | H | | | | | | | | | | | | | | | | | L | | | | | | | | | | | | | |
| 0 | | | H | H | H | H | | | | | | | H | H | H | H | | | | | | | | | | | | | | | | |
| -4 | | | | | | | H | H | | | | | | | | | L | L | L | L | L | L | L | L | L | L | L | L | L | L | L | L |

DIGITAL-TO-ANALOG CONVERTING CIRCUIT AND DIGITAL-TO-ANALOG CONVERTING METHOD

CROSS REFERENCE TO RELATED APPLICATION

This application is based upon and claims the benefit of priority from the prior Japanese Patent Application No. 2006-268816 filed on Sep. 29, 2006; the entire contents of which are incorporated herein by reference.

BACKGROUND OF THE INVENTION

1. Field of the Invention

The present invention relates to a digital-to-analog converting circuit and a digital-to-analog converting method which execute digital-to-analog converting by using redundant digital-to-analog converting elements.

2. Description of the Related Art

Generally, an output waveform of a digital-to-analog converting circuit or converter (abbreviated as DAC) includes a Return to Zero (RTZ) waveform and a Non-Return to Zero (NRTZ) waveform. FIG. 11 illustrates ideal waveforms of RTZ and NRTZ in a 1-bit DAC. An output waveform of a DAC is integrated by an integrator and is outputted, which is used for a general continuous time delta/sigma analog/digital converting circuit or converter (abbreviated as ADC), etc.

As illustrated in FIG. 12, because characteristics of the rising and the falling of an output waveform (before being integrated by an integrator) of an actual DAC are different from each other, particularly in a DAC of a NRTZ output, an error of an integrated value is induced depending on an input code (or output code).

As illustrated in a NRTZ example of FIG. 12, if it is assumed that an error attributed to the difference of the rising and the falling is Δ, in the case that an input code is HHHLLHL, an error of the output code is three Δ as understood from the number of parts illustrated by diagonal lines, and in the case that an input code is HLHLHLH, the error is six Δ.

Thus, in the case of NRTZ, when an input code continues and discontinues, an output value of an error attributed to the difference of the rising and the falling (the number of the rising and the falling) is different, so that the integrated value is also different.

A DAC of a RTZ output transitions from a zero status every time, so that an error component does not depend on an input code (it becomes a gain error).

On the other hand, when a DAC output is integrated, a clock jitter (hereinafter, jitter) of a clock which is a synchronizing signal for executing a D/A converting becomes also an error cause. An integrator integrates a DAC output during a clock cycle. As illustrated in FIG. 13, when the same jitter (σ[psec]) is provided to DACs of RTZ and NRTZ output, an amplitude of the RTZ output is 1/δ (δ<1) times as large as an amplitude of the NRTZ output, and the RTZ output is influenced by a jitter every time a clock is inputted, so that it is easily influenced by a jitter. As a bandwidth is wider, the influence of a jitter is more serious.

In a DAC of multiple bits, an error of a conversion level attributed to the production variation of D/A converting elements is also a cause which degrades a linearity of a DAC.

As an improvement measure, it is widely known in the field of the Invention that the linearity is improved by using a matching technology of dynamic elements (dynamic element matching, abbreviated as DEM) as described in the first and second patent documents, U.S. Pat. Nos. 3,982,172 and 4,703,310.

Such a technology has a noise shaping function for performing an operation which prevents the same converting element from being selected in each D/A converting, averages errors, and banishes noises due to the higher harmonic distortion attributed to the variation of D/A converting elements outside the band.

Conventionally, in a configuration of a continuous time delta/sigma ADC, etc., a DAC of RTZ output has been frequently used to reduce the above influence of errors depending on an output waveform.

However, as described above, a RTZ waveform is easily influenced by jitters, so that the influence seriously degrades the accuracy in a wide band usage.

While the above first and second patent documents can reduce errors due to the variation of D/A converting elements with a DEM processing, it can not reduce errors attributed to the difference of the rising and the falling of an output waveform.

SUMMARY OF THE INVENTION

A digital-to-analog converting circuit according to an embodiment of the present invention includes:

2N or more number of digital-to-analog converting elements converting an input digital code of N+1 (N is an integer equal to or more than two) values to an analog code and outputting;

a selecting section selecting N-number of digital-to-analog converting elements; and a control section controlling a second selection so that each of at least N-number of digital-to-analog converting elements does not continuously output the same analog code at a second digital-to-analog converting timing following a first selection of N-number of digital-to-analog converting elements by the selecting section at a first digital-to-analog converting timing.

A digital-to-analog converting method according to an embodiment of the present invention that includes converting an input digital code of N+1 (N is an integer equal to or more than two) values to an analog code by using 2N or more number of digital-to-analog converting elements to output, the digital-to-analog converting method including:

selecting N-number of digital-to-analog converting elements at a first digital-to-analog converting timing to execute a first digital-to-analog conversion; and selecting N-number of digital-to-analog converting elements to execute a second digital-to-analog converting so that each of at least N-number of digital-to-analog converting elements used for the digital-to-analog converting does not continuously output the same analog code at a second digital-to-analog converting timing following the first digital-to-analog converting timing.

BRIEF DESCRIPTION OF THE DRAWINGS

FIG. 1 is a block diagram illustrating a configuration example of a digital-to-analog converting circuit according to a first embodiment of the present invention;

FIG. 2 is an explanatory diagram of a digital-to-analog converting algorithm according to the first embodiment;

FIG. 5 is an explanatory diagram of a digital-to-analog converting algorithm according to the second embodiment;

FIG. 6 is an explanatory diagram of a digital-to-analog converting algorithm according to the third embodiment;

FIG. 8 is an explanatory diagram of a digital-to-analog converting algorithm according to the fourth embodiment;

FIG. 10 is an explanatory diagram of a digital-to-analog converting algorithm according to the fifth embodiment;

DETAILED DESCRIPTION OF THE INVENTION

Figure 3:
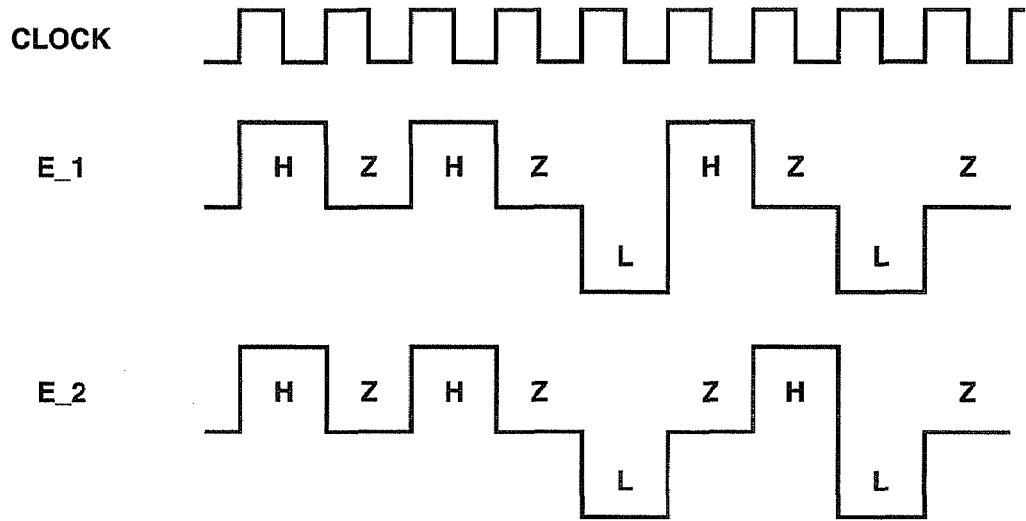
FIG. 3 is such a timing diagram that D/A converting elements E_1 and E_2 are selected with the digital-to-analog converting algorithm of FIG. 2.

Embodiments of the present invention will be described below referring to the drawings.

First Embodiment

FIG. 1 illustrates a configuration example of a digital-to-analog converting circuit (abbreviated as DAC) 1 according to a first embodiment of the present invention.

An input digital code of N+1 (N is an integer equal to or larger than two) values is inputted to the DAC 1. In the case of FIG. 1, such a case that N is eight is illustrated for the simplifying. The input digital code of N+1 values, i.e. nine values, is inputted to a thermometer code converting circuit 2, and is also inputted to a control circuit 3.

The thermometer code converting circuit 2 converts the input digital code of nine values to a thermometer code. Meanwhile, the thermometer code is a code expressed with the number of High levels, i.e. H (or +1), (therefore, the number of Low levels, i.e. L (or −1), is also determined).

A thermometer digital code of N+1 values, i.e. nine values, is inputted to an input terminal of a selecting logic 4, and the output terminals are connected to a D/A converting element set E (in FIG. 1, illustrated as E(5) by using the number 5) including 2N, i.e. sixteen D/A converting elements E_1 to E_16.

The selecting logic 4 selects eight thermometer digital codes converted to thermometer codes so as to be inputted to eight of the sixteen D/A converting elements.

The selection by the selecting logic 4 is controlled by the control circuit 3. The control circuit 3 decides the inputted input digital codes, and controls the selection by the selecting logic 4 with the decided input digital codes. A selected status by the selecting logic 4 is memorized by, for example, a flip-flop (in the drawing, abbreviated as F/F) 6 as a selection information memorizing unit.

The control circuit 3 controls the selecting of the selecting logic 4 with reference to the selection information memorized in the flip-flop 6, for the thermometer digital codes inputted in a time-series to the selecting logic 4. For example, the control circuit 3 controls an operation which is selected next by the selecting logic 4 with reference to the previously selected selection information.

The selecting logic 4 is controlled by the control circuit 3 to select so that the same D/A converting element of all of the selected D/A converting elements does not continuously output the same analog codes.

In a configuration example illustrated in FIG. 1, while such a configuration is illustrated that an input digital code of nine values is inputted to the control circuit 3, it may be configured so that the thermometer digital codes are inputted, which are outputs of the thermometer code converting circuit 2.

Without limiting to the configuration example illustrated in FIG. 1, for example, the selecting logic 4 itself includes the flip-flop 6, and may select based on the selection information memorized in the flip-flop 6 so that the same D/A converting element does not continuously output the same analog codes.

Output signals of the sixteen D/A converting elements E_1 to E_16 are inputted to an adder 7, and the adder 7 adds the output signals to output a D/A-converted analog signal from an output terminal of the DAC 1.

As described above, the DAC 1 according to the first embodiment includes the D/A converting element set E including redundant D/A converting elements for the input digital code of N+1 values. More specifically, the DAC 1 includes 2N or more number of redundant D/A converting elements for the input digital code of N+1 values. In the case of FIG. 1, the number is 2N, which is the minimum configuration number in such a case that the number of D/A converting elements is 2N or more.

In such a configuration, as described below, even in the case of the NRTZ signal, errors depending on input codes can be eliminated or sufficiently reduced, and a highly accurate digital-to-analog converting can be executed.

While the thermometer digital codes of two values, H or L, are inputted to the D/A converting elements used for the D/A converting, the DAC 1 according to the present embodiment controls the selecting so that the same D/A converting element does not continuously output the same analog code. Thereby, the DAC 1 can process NRTZ outputs with the small influence of jitters, and reduce errors due to the rising and the falling.

Next, operations of the D/A conversion by the DAC 1 according to the present embodiment will be described in detail.

FIG. 2 illustrates an example of selecting algorithms of D/A converting methods by the DAC 1, etc. illustrated in FIG. 1. In FIG. 2, the sixteen D/A converting elements E_1 to E_16 illustrated in FIG. 1 are abbreviated as the numbers 1 to 16 at cells directly under D/A converting elements.

In addition, in FIG. 2, the eight thermometer digital codes inputted to such D/A converting elements E_1 to E_16 are illustrated as H and L under the D/A converting elements E_1 to E_16, and the analog outputs outputted from the adder 7 at that time are illustrated at the left side. This example illustrates such a case that if the thermometer digital code is H, an output of the D/A converting element is +1, if it is L, the output is −1, and such an output is added at the adder 7 to be outputted.

Thus, as illustrated in FIG. 2, when the number of Hs is eight, the number of Hs is seven and the number of L is one, the number of Hs is six and the number of Ls is two, . . . , and the number of Ls is eight, the analog output becomes nine values corresponding to +8, +6, +4, . . . , and −8 respectively. The D/A converting element corresponding to a part of space in FIG. 2 indicates the D/A converting element which is not selected by the selecting logic 4. A code Z is used to expressly indicate such an unselecting status. The other embodiments described below will be described with such a converting example.

As illustrated in FIG. 2, the thermometer digital codes of H (+1) or L (−1) are inputted at a time to the eight D/A converting elements, the thermometer digital codes are not inputted to the other D/A converting elements, and such D/A converting elements are not selected (Z). That is, the D/A converting element includes three status of H, L, and Z.

The selecting logic 4 selects the D/A converting element to which H or L is inputted in the D/A converting element set E including the sixteen D/A converting elements. The selecting by the selecting logic 4 is controlled by the control circuit 3. Thereby, the input digital code of nine values is converted to an analog output.

Operations in such a case are as follows.
(1) For example, it is assumed that the thermometer digital codes are HHHHHHLL, which are inputted in synchronization with a D/A converting clock which is a D/A converting timing.

In such a case, the analog output is +4 which is D/A-converted by the DAC 1 to be outputted, so that it is expressed as HHHHHHLL (+4). In addition, it is assumed that Hs are inputted to the D/A converting elements E_1 to E_5, and E_16, and Ls are inputted to the D/A converting elements E_6 and E_7. No signals are inputted to the other D/A converting elements (Z).
(2) If it is assumed that the thermometer digital codes become HHHHHLLL (+2) at next D/A conversion clock (hereinafter, abbreviated just as clock), the selecting logic 4 selects five elements to which Hs are inputted from the elements E_6 to E_15 except the D/A converting elements E_1 to E_5, and E_16 to which Hs have been inputted, and selects three elements to which Ls are inputted from the D/A converting elements E_1 to E_5, and E_8 to E_16 except E_6 and E_7 to which Ls have been inputted.
(3) In an example of FIG. 2, E_6 to E_10 are selected as the D/A converting elements to which Hs are inputted, and E_11 to E_13 are selected as the D/A converting elements to which Ls are inputted. The other D/A converting elements E_1 to E_5, and E_14 to E_16 are Z.
(4) If it is assumed that the thermometer digital codes become HHHHLLLL (0) at further next clock, the selecting logic 4 selects four D/A converting elements to which Hs are inputted from the elements except the D/A converting elements E_6 to E_10 to which Hs have been inputted, and selects four D/A converting elements to which Ls are inputted from the elements except E_11 and E_13 to which Ls have been inputted.
(5) In an example of FIG. 2, E_11 to E_14 are selected as the D/A converting elements to which Hs are inputted, and E_15, E_16, E_1, and E_2 are selected as the D/A converting elements to which Ls are inputted. The other D/A converting elements E_3 to E_10 are Z.
(6) Similarly, every time the clock is inputted, according to the thermometer digital codes, the selecting logic 4 selects the D/A converting elements to which Hs are inputted from the D/A converting elements except the elements to which Hs have been inputted, and selects the D/A converting elements to which Ls are inputted from the D/A converting elements except the elements to which Ls have been inputted. The unselected D/A converting elements become Z.

FIG. 3 illustrates such a status that the D/A converting elements, for example, E_1 and E_2, are selected in synchronization with the clock in FIG. 2, and the output code in the case.

The DAC 1 according to the present embodiment uses a D/A converting means which includes two times or more D/A converting elements than the number of D/A converting elements to which signals are inputted.

Such a D/A converting element selecting algorithm is applied that L is inputted or Z status is set at the next clock to the D/A converting element to which H has been inputted at some clock, and H is inputted or Z status is set at the next clock to the D/A converting element to which L has been inputted at some clock.

Thereby, in the DAC 1, in all of the selected D/A converting elements, the same D/A converting element does not continuously output the same code. Thus, the code dependence of errors attributed to the difference of the rising and the falling of an output waveform of the NRTZ output can be eliminated by using the DAC 1.

In the DAC 1 according to the present embodiment, the transitions of an output signal in the same D/A converting element includes status of H⇔Z, L⇔Z, and H⇔L as illustrated in FIG. 2 or FIG. 3.

As described above, according to the DAC 1 according to the present embodiment, in all of the selected D/A converting elements, the same D/A converting element does not continuously output the same code. Thus, the code dependence of errors attributed to the difference of the rising and the falling of an output waveform of the NRTZ output can be eliminated. Therefore, the DAC 1 can execute a highly accurate D/A converting.

The DAC 1 according to the present embodiment can be also applied to a DAC outputting NRTZ in which the influence of jitters is little. For example, it can be also applied to a wide band multiple bits continuous time delta/sigma ADC, etc.

Meanwhile, in an example of FIG. 2, while the control circuit 3 controls the selecting by the selecting logic 4 so that the D/A converting elements converting a digital code of H are shifted as circulating in such a direction that the sixteen D/A converting elements are arranged, it is not limited to such a control (described later).

In addition, the selecting logic 4 may be configured to include the functions of the control circuit 3. The above configuration may be applied to other embodiments.

Second Embodiment

Next, a second embodiment according to the present invention will be described. The DAC 1 according to the first embodiment eliminates or reduces the input code dependence attributed to the difference of the rising and the falling of an output waveform which is apparent in the NRTZ output waveform as a D/A converting element selecting algorithm.

A DAC 11 according to the present embodiment applies a dynamic element matching (DEM) algorithm which can reduce the input code dependence, reduce errors attributed to variations among the D/A converting elements, and improve the linearity.

Figure 4:
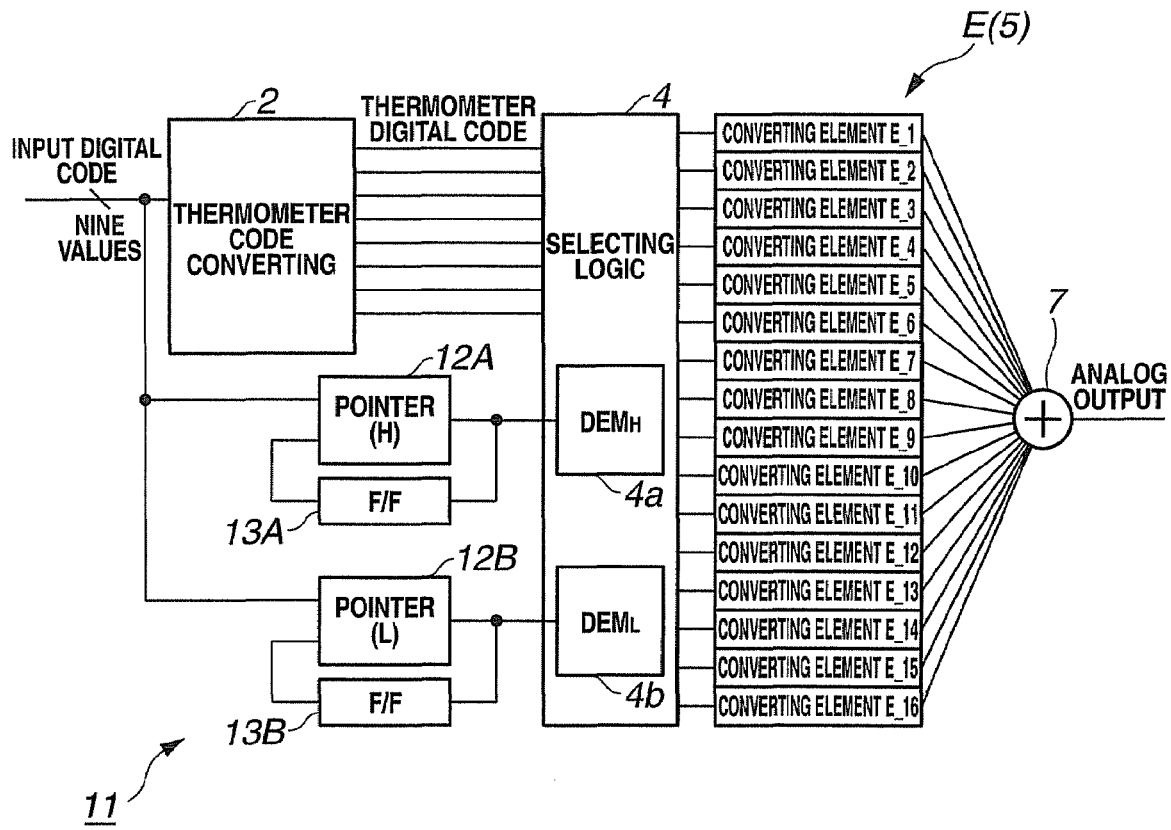
FIG. 4 is a block diagram illustrating a configuration example of a digital-to-analog converting circuit according to a second embodiment of the present invention.

FIG. 4 illustrates an example of a configuration of the DAC 11 according to the present embodiment.

The DAC 11 according to the present embodiment includes one set of D/A converting element set E having two times or more D/A converting elements than N-number of D/A converting elements for the input digital code of N+1 values. The DAC 11 includes the selecting logic 4 realizes a D/A converting element selecting algorithm which selects N-number of D/A converting elements at a time from the D/A converting element set E.

The selecting logic 4 includes two selecting logic units $DEM_H$ 4a and $DEM_L$ 4b. Meanwhile, 4a and 4b are omitted in the specifications.

The D/A converting element selecting algorithm according to the present embodiment is such an algorithm that a primary DEM algorithm is applied to the D/A converting element selecting algorithm according to the first embodiment.

Such a D/A converting element selecting algorithm selects the D/A converting elements from one set of D/A converting element set E so that the total of the number of the D/A converting elements to which H (+1) is inputted and the number of the D/A converting elements to which L (−1) is inputted is N.

In the D/A converting element set E, the D/A converting element to which H (+1) is inputted is selected by the selecting logic unit $DEM_H$ and the D/A converting element to which L (−1) is inputted is selected by the selecting logic unit $DEM_L$ respectively so that the primary DEM algorithm is executed.

The two selecting logic units $DEM_H$ and $DEM_L$ are connected to two pointer circuits 12A and 12B to which the input digital codes are inputted, respectively.

The pointer circuits 12A and 12B store selection information on the selecting logic units $DEM_H$ and $DEM_L$, that is, information on the selected D/A converting elements (E_1, etc.) like an address on a memory area provided in the pointer circuits 12A and 12B corresponding to the number of Hs and Ls of the input digital codes, and change (shift) the selection information in the D/A converting elements E_1 to E_16 so as to realize the DEM, that is, control like a pointer for processing an address variable.

The selection information of the pointer circuits 12A and 12B is memorized in the flip-flops 13A and 13B respectively. At next clock, the pointer circuits 12A and 12B refer to the previous selection information memorized in the flip-flops 13A and 13B, and change the selection information so as to realize the DEM. Thereby, the input digital code of N+1 values is converted to an analog output according to the DEM algorithm.

In the present embodiment, a configuration of a minimum number of D/A converting elements includes one set of D/A converting element set E having 2N-number of D/A converting elements for the input digital code of N+1 values, and includes the two selecting logic units $DEM_H$ and $DEM_L$ which select the D/A converting elements from the D/A converting element set E. FIG. 4 illustrates a configuration example of the DAC 11 converting the input digital code of 9 values (in the case that N=8) to an analog output for the simplifying. In the DAC 11 illustrated in FIG. 4, in addition to the above configuration components, the thermometer code converting circuit 2 and the adder 7 are provided like the DAC 1 illustrated in FIG. 1.

Next, the operations will be described mainly referring to the D/A converting element selecting algorithm illustrated in FIG. 5, that is, the DEM algorithm realizing the DEM.

(1) The DAC 11 includes one set of D/A converting element set E including the sixteen D/A converting elements, and the two selecting logic units $DEM_H$ and $DEM_L$ as illustrated in FIG. 4. The selection of the D/A converting elements by the two selecting logic units $DEM_H$ and $DEM_L$ is determined by the pointer circuits 12A and 12B respectively.

(2) First, it is assumed that the D/A converting elements (hereinafter, abbreviated as pointer) corresponding to addresses selected at the initial setting in the two selecting logic units $DEM_H$ and $DEM_L$ are the D/A converting elements E_1 and E_16 respectively.

(3) When the thermometer digital codes are HHHHHLLL (+2), the selecting logic unit $DEM_H$ selects the D/A converting elements E_1 to E_5 in the D/A converting element set E as the D/A converting elements to which H is inputted, and the selecting logic unit $DEM_L$ selects the D/A converting elements E_16 to E_14 in the D/A converting element set E as the D/A converting elements to which L is inputted.

(4) At next clock, the pointer of the selecting logic unit $DEM_H$ moves to the D/A converting element E_6 which is next to the D/A converting element E_5 to which H has been inputted, and the pointer of the selecting logic unit $DEM_L$ moves to the D/A converting element E_13 which is prior by one to the D/A converting element E_14 to which L has been inputted.

(5) When the thermometer digital codes are HHHHHHHL (+6), the D/A converting elements E_6 to E_12 in the D/A converting element set E are selected as the D/A converting elements to which H is inputted, and the D/A converting element E_13 in the D/A converting element set E is selected as the D/A converting elements to which L is inputted.

(6) At further next clock, the pointer of the selecting logic unit $DEM_H$ moves to the D/A converting element E_13 which is next to the D/A converting element E_12, and the pointer of the selecting logic unit $DEM_L$ moves to the D/A converting element E_12 which is prior by one to the D/A converting element E_13.

(7) According to the thermometer digital codes, the selecting logic unit $DEM_H$ selects from E_13 as the D/A converting element to which H is inputted, and the selecting logic unit $DEM_L$ selects in an inverse direction of the selecting logic unit $DEM_H$ from E_12 as the D/A converting element to which L is inputted.

(8) Every time the clock is inputted, the selecting logic unit $DEM_H$ and the selecting logic unit $DEM_L$ repeat the same operations to select the D/A converting elements to which H and L are inputted as circulating in an inverse direction respectively.

In the present embodiment executing such a operation, by using the D/A converting element set E including two times or more D/A converting elements than the number of the D/A converting elements selected by the DAC 11, L is inputted or unselecting status, Z is set at the next clock to the D/A converting element to which H has been inputted at some clock. Similarly, H is inputted or the unselecting status is set at the next clock to the D/A converting element to which L has been inputted at some clock.

The transitions of an output signal at the same D/A converting element include the status of H$\Leftrightarrow$L, in addition to H$\Leftrightarrow$Z and L$\Leftrightarrow$Z. Thereby, in all of the selected D/A converting elements, the same D/A converting element does not continuously output the same code.

Thus, as described in the first embodiment, the code dependence of errors attributed to the difference of the rising and the falling of an output waveform can be eliminated. And the NRTZ output in which the influence of jitters is small can be processed, and the errors due to the rising and the falling can be reduced.

Further, the present embodiment can reduce errors due to the variation among the D/A converting elements with the DEM effect by applying the primary DEM algorithm in an inverse direction to H and L.

That is, the present embodiment has a noise shaping function for performing an operation which prevents the same element from being selected in each D/A converting, averages errors, banishes noises due to the higher harmonic distortion attributed to the variation among D/A converting elements outside the band of the D/A conversion, and improves the linearity of the D/A converting.

Third Embodiment

Next, a third embodiment of the present invention will be described. In the DAC 1 according to the first embodiment, the transitions of an output signal include the status of H⇔L in addition to H⇔Z and L⇔Z.

In the present embodiment, a configuration of a DAC including only the status of H⇔Z and L⇔Z as a signal transition, and a D/A converting element selecting algorithm will be described.

The DAC according to the present embodiment can adopt, for example, the DAC 1 illustrated in FIG. 1. However, the control circuit 3 executes a control which is different from that of the first embodiment.

The DAC according to the present embodiment provides the D/A converting element set E including 2N or more number of D/A converting elements for the input digital code of N+1 values.

The DAC according to the present embodiment includes the selecting logic 4 selecting N-number of D/A converting elements to which signals are inputted for the D/A converting element set E. H (+1) or L (−1) is inputted to the N D/A converting elements, and the other D/A converting elements are not selected, and no signal is inputted (Z).

The D/A converting element includes three status of H, L, and Z. In the D/A converting element set E, the D/A converting elements to which H or L is inputted is selected by the selecting logic 4.

Thereby, the input digital code of N+1 values is converted to an analog output.

For the simplifying, a DAC which converts the input digital code of 9 values to an analog output is exemplified (the case that N=8), and an algorithm by the selecting logic 4 and the like will be described. The number of D/A converting elements is sixteen, minimum. An example of D/A converting element selecting algorithm in such a case will be shown in FIG. 6. As illustrated in FIG. 6, an analog output of nine values: −8, −6, −4, −2, 0, 2, 4, 6, and 8 can be obtained.

The operations will be described below in more detail.

(1) The DAC according to the present embodiment includes the D/A converting element set E including sixteen D/A converting elements, and the selecting logic 4 selecting the D/A converting elements.

(2) For example, when the thermometer digital codes are HHHHHHLL (+4), it is assumed that Hs are inputted to the D/A converting elements E_1 to E_6, and Ls are inputted to the D/A converting elements E_7 and E_8. No signal is inputted to the other D/A converting elements E_9 to E_16 (Z).

(3) At next clock, if it is assumed that the thermometer digital codes become HHHHHLLL (+2), the selecting logic 4 selects five D/A converting elements to which Hs are inputted, and selects three D/A converting elements to which Ls are inputted from the D/A converting elements except the D/A converting elements E_1 to E_8 to which Hs or Ls have been inputted, that is, the D/A converting elements E_9 to E_16 whose status has been Z. In an example of FIG. 6, the selecting logic 4 selects E_9 to E_13 as the D/A converting elements to which Hs are inputted, and E_13 to E_16 as the D/A converting elements to which Ls are inputted. The other D/A converting elements E_1 to E_8 are Z.

(4) At further next clock, if it is assumed that the thermometer digital codes become HHHHLLLL (0), the selecting logic 4 selects four D/A converting elements to which Hs are inputted, and selects four D/A converting elements to which Ls are inputted from the D/A converting elements except the D/A converting elements E_9 to E_16 to which Hs or Ls have been inputted, that is, the D/A converting elements E_1 to E_8 whose status has been Z. In an example of FIG. 6, the selecting logic 4 selects E_1 to E_4 as the D/A converting elements to which Hs are inputted, and E_5 to E_8 as the D/A converting elements to which Ls are inputted. The other D/A converting elements E_9 to E_16 are Z.

(5) Similarly, every time a clock is inputted, for the thermometer digital codes, the selecting logic 4 selects the D/A converting elements to which signals are inputted from the D/A converting elements except the D/A converting elements to which Hs or Ls have been inputted, that is, the D/A converting elements whose status has been Z. The selecting logic 4 selects so that the D/A converting elements which have been selected at the previous clock are certainly set to Z.

The DAC according to the present embodiment uses the D/A converting element set E including two times or more D/A converting elements than the number of D/A converting elements to which signals are inputted, and applies such a selecting algorithm that the D/A converting elements which have been selected at some clock are not selected at the next clock (Z).

Thereby, the same D/A converting element does not continuously output the same analog code. Thus, the code dependence of errors attributed to the difference of the rising and the falling of an output waveform of the NRTZ output can be eliminated. The transition of an output signal in the same D/A converting element is certainly H⇔Z and L⇔Z.

As described above, by prohibiting the transition of H⇔L, and limiting to only the transitions of H⇔Z and L⇔Z, it is possible to reduce the influence of the larger rising and falling characteristics induced in the case of the transition of H⇔L. Thus, according to the present embodiment, more highly accurate D/A conversion can be realized.

Fourth Embodiment

Next, a fourth embodiment of the present invention will be described. The present embodiment applies the dynamic element matching (DEM) algorithm which can reduce errors attributed to the mismatch among the D/A converting elements, and improve the linearity to the D/A converting element selecting algorithm of the DAC of the third embodiment.

Figure 7:
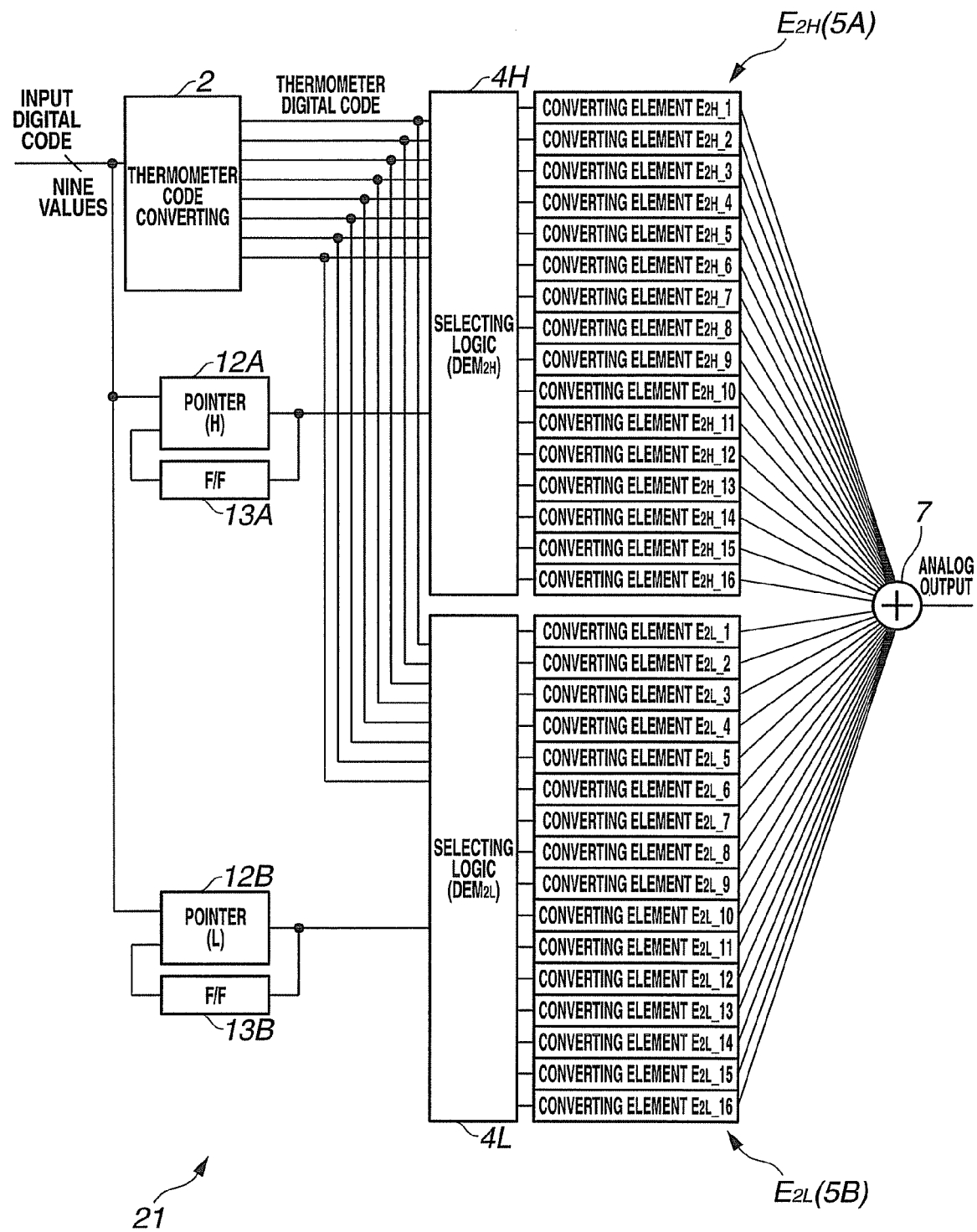
FIG. 7 is a block diagram illustrating a configuration example of a digital-to-analog converting circuit according to a fourth embodiment of the present invention.

FIG. 7 illustrates a DAC 21 according to the present embodiment. The DAC 21 includes two D/A converting element sets $E_{2H}$ and $E_{2L}$ (In FIG. 7, also illustrated as 5A and 5B) having two times or more D/A converting elements than N-number of D/A converting elements respectively for the input digital code of N+1 values.

An output signal of each D/A converting element included in the two D/A converting element sets $E_{2H}$ and $E_{2L}$ is inputted to the adder 7 to be added at the adder 7, and an analog signal is outputted.

The DAC 21 includes two selecting logics $DEM_{2H}$ and $DEM_{2L}$ (In FIG. 7, also illustrated as 4H and 4L) which select N-number of D/A converting elements in total from each of the D/A converting element sets $E_{2H}$ and $E_{2L}$, and as in FIG.

4, the thermometer digital codes are inputted to each of the selecting logics $DEM_{2H}$ and $DEM_{2L}$ through the thermometer code converting circuit 2.

As in FIG. 4, each of the selecting logics $DEM_{2H}$ and $DEM_{2L}$ is connected to the pointer circuits 12A and 12B respectively, and as in FIG. 4, each of the pointer circuits 12A and 12B is connected to the flip-flops 13A and 13B respectively. The DAC 21 realizes a D/A converting element selecting algorithm described below.

The D/A converting element selecting algorithm is such a algorithm that the primary DEM algorithm is applied to the D/A converting element selecting algorithm of the third embodiment.

The D/A converting element set $E_{2H}$, one of the two D/A converting element sets $E_{2H}$ and $E_{2L}$, selects the D/A converting element to which H (+1) is inputted, and the other D/A converting element set $E_{2L}$, selects the D/A converting element to which L (−1) is inputted.

N-number of D/A converting elements of the D/A converting element sets $E_{2H}$ and $E_{2L}$ are selected in total. No signal is inputted to the other D/A converting elements (Z).

In each of the D/A converting element sets $E_{2H}$ and $E_{2L}$, for the D/A converting element set $E_{2H}$, the D/A converting element to which a signal is inputted is selected by the selecting logic $DEM_{2H}$ so that the primary DEM algorithm is executed.

Similarly, for the D/A converting element set $E_{2L}$, the D/A converting element to which a signal is inputted is selected by the selecting logic $DEM_{2L}$ so that the primary DEM algorithm is executed. Thereby, the input digital code of N+1 values inputted to the DAC 21 is converted to an analog output.

In the present embodiment, for the input digital code of N+1 values, a configuration example of a minimum number of D/A converting elements includes the two D/A converting element sets $E_{2H}$ and $E_{2L}$ having 2N-number of D/A converting elements respectively, and the two selecting logics $DEM_{2H}$ and $DEM_{2L}$ for selecting N-number of D/A converting elements in total from each of the D/A converting element sets $E_{2H}$ and $E_{2L}$.

For the simplifying, FIG. 7 illustrates the multi-bit DAC 21 (N=8) converting the input digital code of nine values to an analog output. The DAC 21 according to the present embodiment also uses two sets of sixteen converting elements which is a minimum configuration number of D/A converting elements in a configuration of 2N (N=8) or more number of converting elements.

Next, operations of the present embodiment will be described. The DEM algorithm according to the present embodiment is illustrated in FIG. 8. Such a DEM algorithm will be described below.

(1) As illustrated in FIG. 7, the DAC 21 according to the present embodiment includes two D/A converting element sets $E_{2H}$ and $E_{2L}$ having sixteen D/A converting elements respectively, and two selecting logics $DEM_{2H}$ and $DEM_{2L}$ selecting N-number of D/A converting elements at a time from the two D/A converting element sets $E_{2H}$ and $E_{2L}$. The selection of the D/A converting elements by the two selecting logics $DEM_{2H}$ and $DEM_{2L}$ is defined by pointers corresponding to addresses of the pointer circuits 12A and 12B, respectively.

(2) As an initial condition, it is assumed that the pointers of the selecting logics $DEM_{2H}$ and $DEM_{2L}$ are pointing to the D/A converting elements $E_{2H\_1}$ and $E_{2L\_1}$, respectively.

(3) When the thermometer digital codes are HHHHHLLL (+2), the selecting logic $DEM_{2H}$ selects the D/A converting elements $E_{2H\_1}$ to $E_{2H\_5}$ as the D/A converting element to which H (+1) is inputted from the D/A converting element set $E_{2H}$, and the selecting logic $DEM_{2L}$ selects the D/A converting elements $E_{2L\_1}$ to $E_{2L\_3}$ as the D/A converting element to which L (−1) is inputted from the D/A converting element set $E_{2L}$.

(4) At next clock, the pointer of the selecting logic $DEM_{2H}$ moves to the D/A converting element $E_{2H\_6}$ which is next to the D/A converting element $E_{2H\_5}$ selected from the D/A converting element set $E_{2H}$, and the pointer of the selecting logic $DEM_{2L}$ moves to the D/A converting element $E_{2L\_4}$ which is next to the D/A converting element $E_{2L\_3}$ selected from the D/A converting element set $E_{2L}$.

(5) When the thermometer digital codes are HHHHHHHL (+6), the D/A converting elements $E_{2H\_6}$ to $E_{2H\_12}$ in the D/A converting element set $E_{2H}$ are selected as the D/A converting element to which H (+1) is inputted, and the D/A converting element $E_{2L\_4}$ in the D/A converting element set $E_{2L}$ is selected as the D/A converting element to which L (−1) is inputted.

(6) At further next clock, the pointer of the selecting logic $DEM_{2H}$ moves to the D/A converting element $E_{2H\_13}$ which is next to the D/A converting element $E_{2H\_12}$ selected at the D/A converting element set $E_{2H}$, and the pointer of the selecting logic $DEM_{2L}$ moves to the D/A converting element $E_{2L\_5}$ which is next to the D/A converting element $E_{2L\_4}$ selected at the D/A converting element set $E_{2L}$.

(7) According to the thermometer digital codes, at the D/A converting element set $E_{2H}$, the D/A converting element to which H is inputted is selected from the D/A converting element $E_{2H\_13}$, and at the D/A converting element set $E_{2L}$, the D/A converting element to which L is inputted is selected from the D/A converting element set $E_{2L\_5}$.

(8) As described above, every time a clock is inputted, the selecting logics $DEM_{2H}$ and $DEM_{2L}$ repeat the same operation which selects the D/A converting elements to which H or L is inputted respectively as circulating.

The DAC 21 according to the present embodiment uses the two D/A converting element sets $E_{2H}$ and $E_{2L}$ having 2N or more number of D/A converting elements respectively for the input digital code of N+1 values to apply such a selection algorithm that the D/A converting element selected at some clock is not selected at the next clock (Z).

Thereby, the same D/A converting element does not continuously output the same analog code. Thus, when it is applied to a DAC of the NRTZ output, the code dependence of errors attributed to the difference of the rising and the falling of an output waveform can be eliminated.

The transition of an output signal in the same D/A converting element is certainly H⇔Z and L⇔Z. Further, by applying the primary DEM algorithm which separately selects the D/A converting element to which H or L is inputted as circulating for the two D/A converting element sets $E_{2H}$ and $E_{2L}$ to this D/A converting element selecting algorithm, errors due to the variation among the D/A converting elements can be reduced by the operations of the DEM.

Fifth Embodiment

Next, a fifth embodiment of the present invention will be described. The present embodiment applies the dynamic element matching (DEM) algorithm which can reduce errors attributed to the mismatch among the D/A converting elements, and improve the linearity to the D/A converting algorithm according to the third embodiment.

Figure 9:
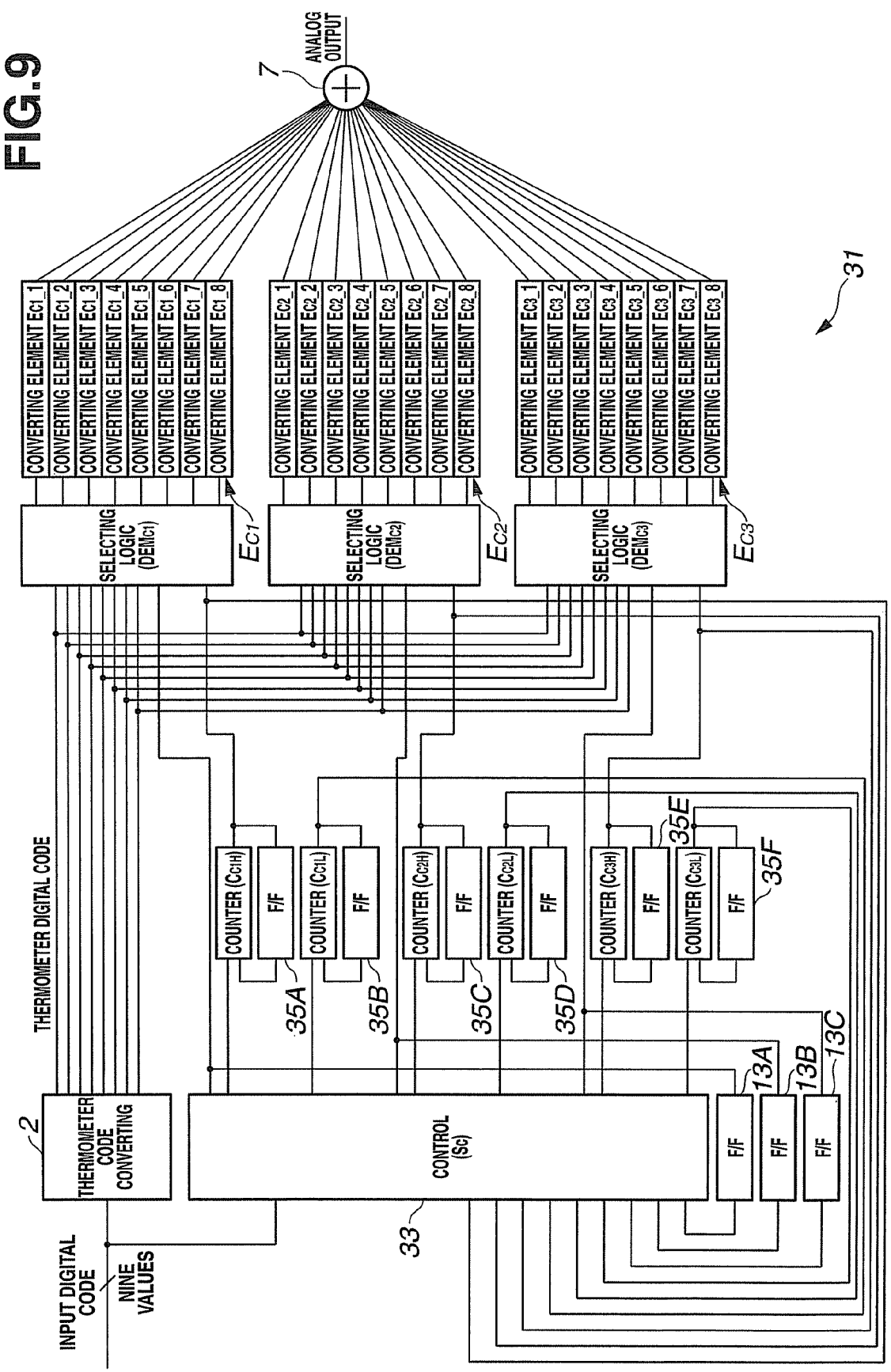
FIG. 9 is a block diagram illustrating a configuration example of a digital-to-analog converting circuit according to a fifth embodiment of the present invention.
Figure 11:
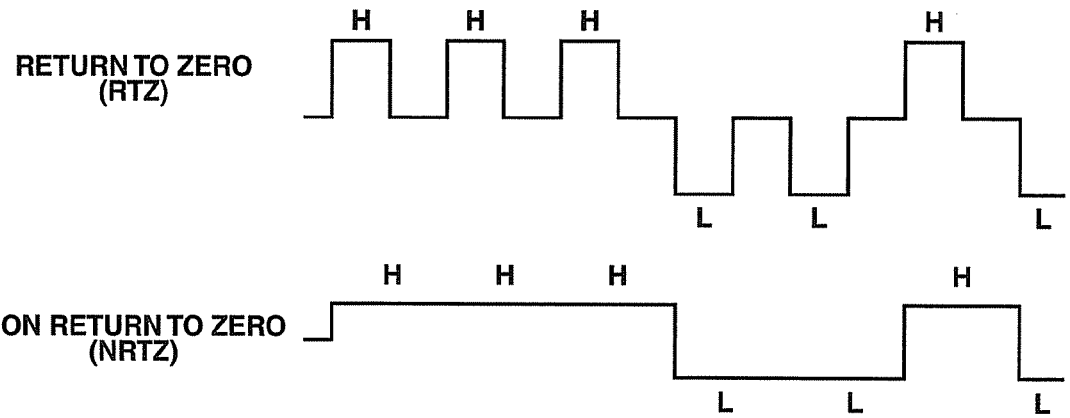
FIG. 11 is a diagram illustrating ideal waveforms of RTZ and NRTZ in a 1-bit digital-to-analog converting circuit.
Figure 12:
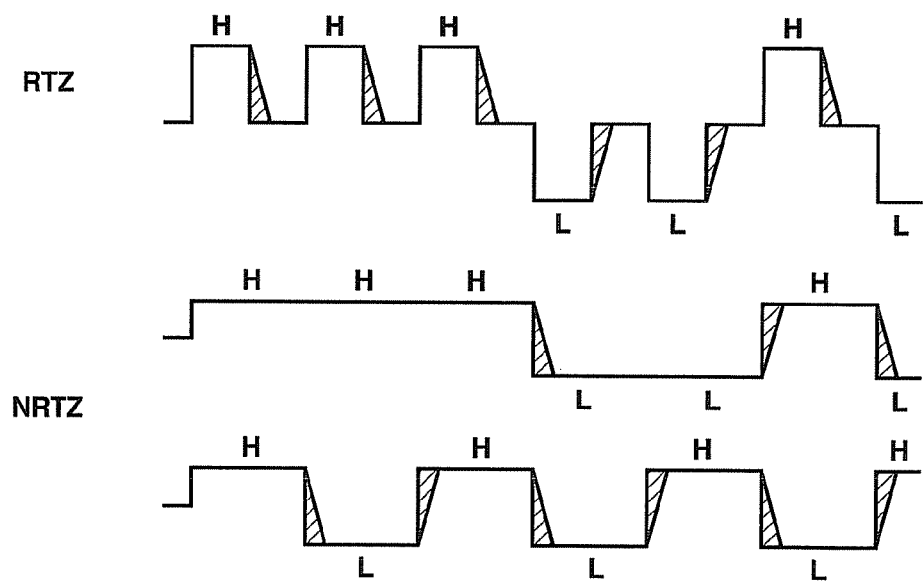
FIG. 12 is a diagram illustrating output waveforms in consideration of the characteristics of the rising and the falling in a digital-to-analog converting circuit.
Figure 13:
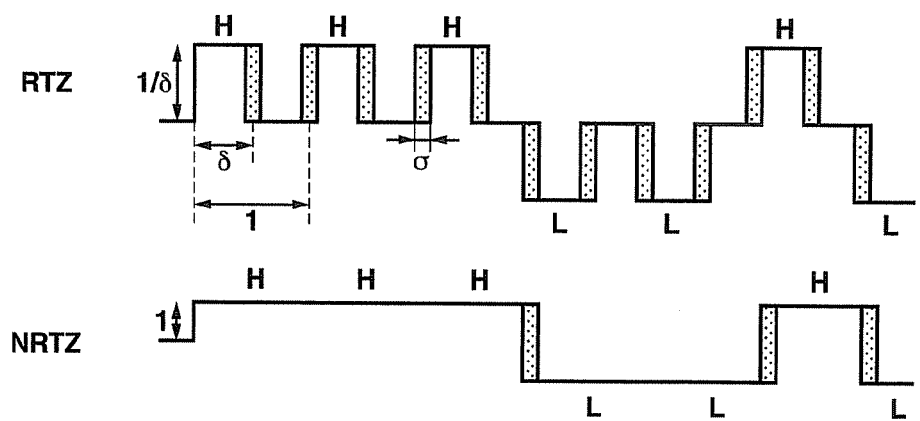
FIG. 13 is a diagram illustrating output waveforms influenced by clock jitters in a digital-to-analog converting circuit.

FIG. 9 illustrates an example of a configuration of a DAC 31 according to the present embodiment.

The DAC 31 according to the present embodiment is configured to include M D/A converting element sets $E_{C1}$, $E_{C2}$, $E_{C3}$, ..., and $E_{CM}$ (M is an integer equal to or more than three) having N-number of D/A converting elements respectively for the input digital code of N+1 values. However, FIG. 9 illustrates a configuration example in the case that M=3, that is, in the case of three D/A converting element sets $E_{C1}$, $E_{C2}$, and $E_{C3}$.

The DAC 31 includes M-number of selecting logics $DEM_{C1}$, $DEM_{C2}$, $DEM_{C3}$, ..., and $DEM_{CM}$ for selecting N-number of D/A converting elements from the D/A converting element sets $E_{C1}$, $E_{C2}$, $E_{C3}$, ..., and $E_{CM}$ respectively, and a control circuit $S_C$ (in FIG. 9, also illustrated as 33) controlling the selecting logics $DEM_{C1}$, $DEM_{C2}$, $DEM_{C3}$, ..., and $DEM_{CM}$ so as to select one D/A converting element set from M D/A converting element sets $E_{C1}$, $E_{C2}$, $E_{C3}$, ..., and $E_{CM}$.

The control circuit $S_C$ decides the inputted input digital code of N+1 values, and refers to the decision result, etc. to control so that one D/A converting element set is selected at each clock.

As described below, the present embodiment realizes such a D/A converting element selecting algorithm that the primary DEM algorithm is applied to the D/A converting element selecting algorithm according to the third embodiment.

It is assumed that the D/A converting element set $E_{C1}$ is selected at some clock by the control of the control circuit $S_C$. In the selected D/A converting element set $E_{C1}$, H (+1) or L (−1) of the thermometer digital codes is inputted to all of N-number of D/A converting elements. No signal is inputted to the D/A converting elements in the other D/A converting element sets which are not selected (Z).

In such a case, the D/A converting element to which H or L is inputted in the D/A converting element set $E_{C1}$ is selected by each corresponding selecting logic $DEM_{C1}$ so that the primary DEM algorithm is executed.

At next clock, the control circuit $S_C$ selects one set from M−1 D/A converting element sets except the selected one according to the input digital code and the number of D/A converting elements used for H (+1) and L (−1) in each D/A converting element set.

The control circuit $S_C$ controls the selection of the selecting logics $DEM_{C1}$, $DEM_{C2}$, and $DEM_{C3}$ so as to select the D/A converting element set so that such a frequency that H (+1) is inputted, and such a frequency that L (−1) is inputted are same in every D/A converting element. Thereby, the DEM algorithm is applied, and the input digital code of N+1 values is converted to an analog output.

In the present embodiment, for example, a configuration of a minimum number of D/A converting elements can be configured to include three D/A converting element sets $E_{C1}$, $E_{C2}$, and $E_{C3}$ which are illustrated in FIG. 9 and have N-number of D/A converting elements respectively for the input digital code of N+1 values.

In such a case, the above configuration includes three selecting logics $DEM_{C1}$, $DEM_{C2}$, and $DEM_{C3}$ for selecting the D/A converting elements corresponding to each D/A converting element set, and the control circuit $S_C$ selecting one D/A converting element set from three D/A converting element sets $E_{C1}$, $E_{C2}$, and $E_{C3}$.

The selections of the three selecting logics $DEM_{C1}$, $DEM_{C2}$, and $DEM_{C3}$ are determined by the pointer circuits respectively. In the case of FIG. 9, for example, the control circuit $S_C$ internally includes three pointer circuits which are not illustrated. The information of the three pointer circuits is stored in the flip-flops 13A, 13B, and 13C, respectively.

In addition, the control circuit $S_C$ is connected to counter circuits $C_{C1H}$, $C_{C1L}$, $C_{C2H}$, $C_{C2L}$, $C_{C3H}$, and $C_{C3L}$ counting the number of D/A converting elements to which the D/A converting element sets $E_{C1}$, $E_{C2}$, and $E_{C3}$ input H (+1) and L (−1) respectively.

The numbers (count number) of D/A converting elements counted by the counter circuits $C_{C1H}$, $C_{C1L}$, $C_{C2H}$, $C_{C2L}$, $C_{C3H}$, and $C_{C3L}$ are stored in the flip-flops 35A, 35B, ..., and 35F. The control circuit $S_C$ can refer to the count numbers $NC_{C1H}$, $NC_{C1L}$, $NC_{C2H}$, $NC_{C2L}$, $NC_{C3H}$, and $NC_{C3L}$ stored in the flip-flops 35A, 35B, ..., and 35F. Referring to such information, the control circuit $S_C$ controls the selection of the selecting logics $DEM_{C1}$, $DEM_{C2}$, and $DEM_{C3}$ so as to select the D/A converting element set so that such a frequency that H (+1) is inputted, and such a frequency that L (−1) is inputted are same in every D/A converting element.

Figure 10:
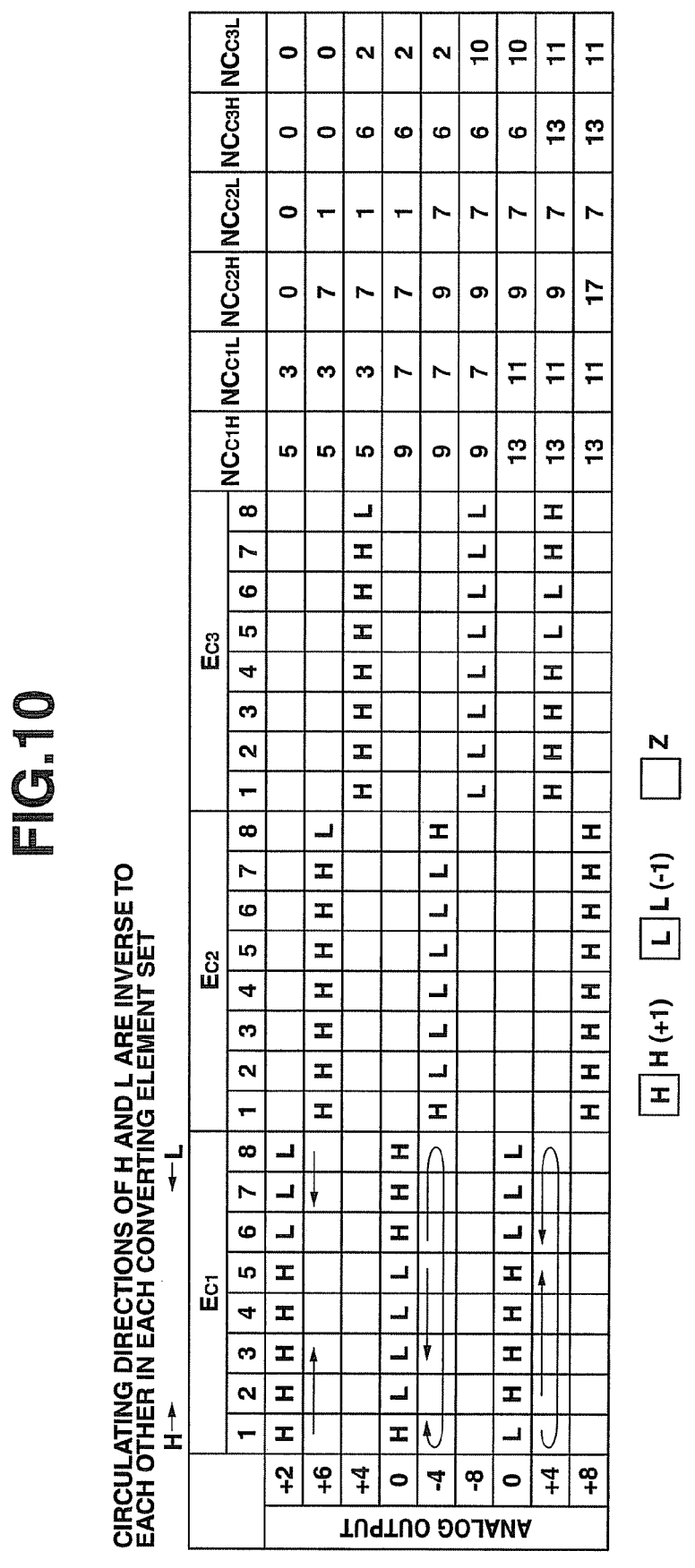

For the simplifying, FIG. 9 illustrates a configuration example of the DAC 31 which converts the input digital code of nine values to an analog output (N=8). FIG. 10 illustrates the DEM algorithm according to such a configuration.

The operations will be described below mainly referring to FIG. 10.

(1) As illustrated in FIG. 9, the DAC 31 in such a case includes the three D/A converting element sets $E_{C1}$, $E_{C2}$, and $E_{C3}$ having eight D/A converting elements respectively, and forms the three selecting logics $DEM_{C1}$, $DEM_{C2}$, and $DEM_{C3}$, the control circuit $S_C$ and the D/A converting element selecting algorithm which is a main configuration element. The selections by the three selecting logics $DEM_{C1}$, $DEM_{C2}$, and $DEM_{C3}$, are determined by the pointer circuits respectively. The control circuit $S_C$ is connected to the counter circuits $C_{C1H}$, $C_{C1L}$, $C_{C2H}$, $C_{C2L}$, $C_{C3H}$, and $C_{C3L}$ counting the number of D/A converting elements to which the D/A converting element sets $E_{C1}$, $E_{C2}$, and $E_{C3}$ input H (+1) and L (−1) respectively, and the flip-flops 35A, 35B, ..., and 35F. In addition, the control circuit $S_C$ can refer to the count numbers $NC_{C1H}$, $NC_{C1L}$, $NC_{C2H}$, $NC_{C2L}$, $NC_{C3H}$, and $NC_{C3L}$.

(2) First, under the control of the control circuit $S_C$, it is assumed that the D/A converting element set $E_{C1}$ is selected, the pointers of the selecting logics $DEM_{C1}$, $DEM_{C2}$, and $DEM_{C3}$ are pointing to $E_{C1}\_1$, $E_{C2}\_1$, and $E_{C3}\_1$ respectively, and the count numbers $NC_{C1H}$, $NC_{C1L}$, $NC_{C2H}$, $NC_{C2L}$, $NC_{C3H}$, and $NC_{C3L}$ of the counter circuits $C_{C1H}$, $C_{C1L}$, $C_{C2H}$, $C_{C2L}$, $C_{C3H}$, and $C_{C3L}$ are 0 respectively.

(3) When the thermometer digital codes are HHHHHLLL (+2), the D/A converting elements $E_{C1}\_1$ to $E_{C1}\_5$ of the D/A converting element set $E_{C1}$ are selected by the selecting logic $DEM_{C1}$ as the D/A converting element to which H is inputted, and $E_{C1}\_6$ to $E_{C1}\_8$ are selected by the selecting logic $DEM_{C1}$ as the D/A converting element to which L is inputted.

(4) At the next clock, the pointer of the selecting logic $DEM_{C1}$ moves to the D/A converting element $E_{C1}\_6$ which is next to the D/A converting element $E_{C1}\_5$ to which H has been inputted in the D/A converting element set $E_{C1}$. The counter circuit $C_{C1H}$ counts 5: the number of D/A converting elements to which H (+1) has been inputted, and the counter circuit $C_{C1L}$ counts 3: the number of D/A converting elements to which L (−1) has been inputted.

(5) The control circuit $S_C$ selects the D/A converting element set to be used from the D/A converting element sets $E_{C2}$ and $E_{C3}$ which have not been used according to the following calculation result so that the usage frequency of every D/A converting element is same for H (+1) and L (−1).

(6) When the thermometer digital codes are HHHHHHHL (+6), in such a case, the number of D/A converting elements to which H (+1) is inputted: $N_H$ is 7, and the number of D/A converting element to which L (−1) is inputted: $N_L$ is 1. The control circuit $S_C$ executes calculations: P2=|$(NC_{C2H}+N_H)-NC_{C3H}$|+|$(NC_{C2L}+N_L)-NC_{C3L}$|, P3=|$(NC_{C3H}+N_H)-NC_{C2H}$|+|$(NC_{C3L}+N_L)-NC_{C2L}$|, and compares P2 and P3. The control circuit $S_C$, when P2<P3, selects the D/A converting element set $E_{C2}$, and when P2>P3, selects the D/A converting element set $E_{C3}$. When P2=P3, the control circuit $S_C$ may select either one. In this case, as P2=P3=8, either one may be selected. Here, it is assumed that the D/A converting element set $E_{C2}$ is selected.

(7) The pointer of the D/A converting element set $E_{C2}$ is pointing to the D/A converting element $E_{C2\_1}$, and the D/A converting elements $E_{C2\_1}$ to $E_{C2\_7}$ in the D/A converting element set $E_{C2}$ are selected by the selecting logic $DEM_{C2}$ as the D/A converting element to which H is inputted, and $E_{C2\_8}$ is selected as the D/A converting element to which L is inputted.

(8) At further next clock, the pointer of the selecting logic $DEM_{C2}$ moves to the D/A converting element $E_{C2\_8}$ which is next to the D/A converting element $E_{C2\_7}$ to which H has been inputted. The counter circuit $C_{C2H}$ counts 7: the number of the D/A converting elements to which H (+1) has been inputted, and the counter circuit $C_{C1L}$ counts 1: the number of the D/A converting element to which L (−1) has been inputted.

(9) When the thermometer digital codes are HHHHHHLL (+4), in such a case, the number of D/A converting elements to which H is inputted: $N_H$ is 6, and the number of D/A converting elements to which L is inputted: $N_L$ is 2. The control circuit $S_C$ executes calculations: P3=|$(NC_{C3H}+N_H)-NC_{C1H}$|+|$(NC_{C3L}+N_L)-NC_{C1L}$|, P1=|$(NC_{C1H}+N_H)-NC_{C3H}$|+|$(NC_{C1L}+N_L)-NC_{C3L}$|, and compares P3 and P1. As the calculation result is P3=2, P1=17, so that P3<P1, and the D/A converting element set $E_{C3}$ is selected.

(10) The pointer of the selecting logic $DEM_{C3}$ is pointing to the D/A converting element $E_{C3\_1}$, and the selecting logic $DEM_{C1}$ selects from the D/A converting element $E_{C3\_1}$ in the D/A converting element set $E_{C1}$ in turn as the D/A converting element to which H is inputted according to the input digital code.

(11) Every time a clock is inputted, the number of the D/A converting elements used in each D/A converting element set is counted. Results of the counting and the input digital code are inputted to the control circuit $S_C$, and the control circuit $S_C$ calculates and compares. The control circuit $S_C$ selects the D/A converting element set used actually for the D/A converting so that the usage frequency of every D/A converting element becomes same for H (+1) and L (−1), that is, the difference among the three count numbers $NC_{C1H}$, $NC_{C2H}$, and $NC_{C3H}$, and the difference among the three count numbers $NC_{C1L}$, $NC_{C2L}$, and $NC_{C3L}$ become smaller.

In the D/A converting element set selected by the control circuit $S_C$, such a same operation is repeated that the D/A converting element to which H or L is inputted is selected by the corresponding selecting logic $DEM_{Ci}$ (i=1, 2, 3) as circulating in a inverse direction.

The DAC 31 according to the present embodiment uses three D/A converting element sets including the D/A converting elements respectively whose number is same as the number of D/A converting elements to which the thermometer digital codes are inputted. Moreover, such a D/A converting element selecting algorithm of the third embodiment is applied that the D/A converting element set selected at some clock is certainly set to a status of Z at next clock. Thereby, the transition of a signal at each D/A converting element is certainly H⇔Z or L⇔Z.

Therefore, in every selected D/A converting element, the same D/A converting element does not continuously output the same analog code. Thus, the code dependence of errors attributed to the difference of the rising and the falling of an output waveform can be eliminated by applying the DAC 31, for example, to a DAC of the NRTZ output.

Furthermore, the selecting algorithm selects the D/A converting element set so that such a frequency that H (+1) is inputted and such a frequency that L (−1) is inputted are same at every D/A converting element. Furthermore, the selecting algorithm executes such a primary DEM algorithm that D/A converting element to which H or L is inputted is selected as circulating in an inverse direction respectively in each D/A converting element set. Thus, errors due to the variation among the D/A converting elements can be reduced by the operation of the DEM.

Meanwhile, the present invention is not limited to configuration examples such as DAC 1 and 11 according to the above embodiments, and is not limited only to the above D/A converting algorithm.

For example, in the first embodiment, FIG. 1 illustrates the DAC 1 which is an example as a DAC with a configuration realizing the D/A converting algorithm which reduces errors depending on an output waveform at the D/A converting. A modified example of a DAC realizing the D/A converting algorithm may be configured below.

The input digital code of N+1 values may be inputted to two D/A converting element sets having N-number of D/A converting elements respectively through the selecting logic 4 selecting N-number of D/A converting elements at a time, and the control circuit 3 may control only the alternate selecting between two D/A converting element sets for the selecting of N-number of D/A converting elements by the selecting logic 4. That is, when controlling the selecting so that the selecting logic 4 selects one D/A converting element set at some clock, the control circuit 3 controls so that the selecting logic 4 selects the other D/A converting element set at the next clock. The control circuit 3 in such a case can be configured with a function of just a selecting switch which selects in synchronization with clocks.

Or, the function, of a selecting switch may be configured to be included in the selecting logic 4.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A digital-to-analog converting circuit comprising:

m×N (m is an integer equal to or more than two and N is an integer equal to or more than two) or more number of digital-to-analog converting elements converting an input digital code of N+1 values to an analog code in one of three states of H level, L level, and non-selection to output;

a first selecting section selecting digital-to-analog converting elements that output r (r is an integer equal to or smaller than N) number of H levels for a thermometer digital code expressing the input digital code with the number of H levels and L levels; and a second selecting section selecting the digital-to-analog converting elements that output N−r number of L levels, wherein selecting of the digital-to-analog converting element is controlled so that the same digital-to-analog converting element does not continuously output the same analog code as the first and second selecting sections cause the digital-to-analog converting elements selected respectively at the first digital-to-analog converting timing and at the second digital-to-analog converting timing to circulate in an inverse direction to each other.

2. A digital-to-analog converting circuit comprising:

a first digital-to-analog converting element set having 2N (N is an integer equal to or more than two) or more number of digital-to-analog converting elements converting an input digital code of N+1 values to an analog code in one of two states of H level and non-selection to output;

a second digital-to-analog converting element set having 2N or more number of digital-to-analog converting elements converting an input digital code to an analog code in one of two states of L level and non-selection to output;

a first selecting section selecting, from the first digital-to-analog converting element set, digital-to-analog converting elements that output r (r is an integer equal to or smaller than N) number of H levels with respect to a thermometer digital code expressing the input digital code with the number of H levels and L levels; and a second selecting section selecting, from the second digital-to-analog converting element set, the digital-to-analog converting elements that output N−r number of L levels, wherein selecting of the digital-to-analog converting element is controlled so that the same digital-to-analog converting element is not continuously selected as the first and second selecting sections cause the digital-to-analog converting elements selected respectively at the first digital-to-analog converting timing and at the second digital-to-analog converting timing to circulate.

3. A digital-to-analog converting circuit comprising:

2N or more number of digital-to-analog converting elements converting an input digital code of N+1 (N is an integer equal to or more than two) values to an analog code to output;

a selecting section selecting N-number of digital-to-analog converting elements; and a control section controlling a second selecting so that each of the at least N-number of digital-to-analog converting elements used for digital-to-analog converting does not continuously output the same analog code at a second digital-to-analog converting timing following a first selecting by the selecting section of the N-number of digital-to-analog converting elements at a first digital-to-analog converting timing, wherein the 2N or more number of digital-to-analog converting elements are formed with M (M is an integer equal to or more than three) digital-to-analog converting element sets having N-number of digital-to-analog converting elements respectively.

4. The digital-to-analog converting circuit according to claim 3, wherein the control section selects one set from the M sets at each digital-to-analog converting timing so that such a frequency that a digital code of an H level is inputted and such a frequency that a digital code of an L level is inputted are same at every digital-to-analog converting element in the digital-to-analog converting element sets which have not been used at a previous digital-to-analog converting timing.

5. The digital-to-analog converting circuit according to claim 4, wherein the selecting section selects the N-number of digital-to-analog converting elements in each digital-to-analog converting element set respectively in order to circulate the digital-to-analog converting elements converting the digital code of the H level and the L level in an inverse direction to each other.

* * * * *